(12) United States Patent
Prakash et al.

(10) Patent No.: US 7,235,420 B2
(45) Date of Patent: Jun. 26, 2007

(54) PROCESS FOR REMOVING AN ORGANIC LAYER DURING FABRICATION OF AN ORGANIC ELECTRONIC DEVICE AND THE ORGANIC ELECTRONIC DEVICE FORMED BY THE PROCESS

(75) Inventors: Shiva Prakash, Santa Barbara, CA (US); Feng Li, Oxnard, CA (US); Linnette Amarilys Lopez Gutierrez, Bear, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/890,360

(22) Filed: Jul. 13, 2004
(Under 37 CFR 1.47)

(65) Prior Publication Data
US 2005/0112881 A1    May 26, 2005

Related U.S. Application Data

(63) Continuation-in-part of application No. 10/625,112, filed on Jul. 22, 2003, now Pat. No. 6,953,705.

(51) Int. Cl.
    *H01L 51/40*      (2006.01)
(52) U.S. Cl. ................ 438/99; 438/706; 257/E21.007; 257/E21.218
(58) Field of Classification Search ................ 438/30, 438/706, 99; 257/E21.007, E21.246, E21.218
See application file for complete search history.

(56) References Cited

U.S. PATENT DOCUMENTS

| 5,550,066 | A | 8/1996 | Tang et al. |
| 6,060,728 | A | 5/2000 | Ghosh et al. |
| 6,106,352 | A | 8/2000 | Fujii |
| 6,153,254 | A | 11/2000 | Young et al. |
| 6,265,319 | B1 | 7/2001 | Jang |
| 6,358,631 | B1 | 3/2002 | Forrest et al. |
| 6,475,836 | B1 | 11/2002 | Suzawa et al. |

(Continued)

OTHER PUBLICATIONS

Stanley Wolf and Richard N. Tauber, Silicon Processing For The VLSI Era, 1986, Lattice Press, vol. I, pp. 568-569 and 581-582.*

(Continued)

*Primary Examiner*—Michael Lebentritt
*Assistant Examiner*—Stanetta Isaac
(74) *Attorney, Agent, or Firm*—John H. Lamming

(57) ABSTRACT

A process for forming an organic electronic device includes the steps of: (a) forming a first conductive member and a conductive lead over a substrate, wherein the first conductive member and conductive lead are spaced apart from each other; (b) forming an organic layer over the substrate, the first conductive member, and the conductive lead; (c) forming a patterned conductive layer over the organic layer, wherein the patterned conductive layer includes a second conductive member, and the patterned conductive layer creates an exposed portion of the organic layer and an unexposed portion of the organic layer; and (d) dry etching at least the exposed portion of the organic layer to expose a portion of the conductive lead using at least one oxygen-containing gas, wherein dry etching is performed at a pressure in a range of approximately 0.01 to 7.5 mTorr.

22 Claims, 9 Drawing Sheets

U.S. PATENT DOCUMENTS

| | | | |
|---|---|---|---|
| 6,541,790 B1 * | 4/2003 | Pichler | 257/40 |
| 6,566,156 B1 * | 5/2003 | Sturm et al. | 438/35 |
| 6,664,564 B2 * | 12/2003 | Peng | 257/40 |
| 6,881,598 B2 * | 4/2005 | Pichler | 438/22 |
| 2002/0055210 A1 | 5/2002 | Peng | |
| 2002/0072139 A1 | 6/2002 | Kashiwabara | |
| 2003/0030061 A1 * | 2/2003 | Peng | 257/79 |
| 2003/0064324 A1 | 4/2003 | Wei et al. | |
| 2003/0094607 A1 | 5/2003 | Ewald et al. | |
| 2003/0224547 A1 * | 12/2003 | Lee et al. | 438/22 |

OTHER PUBLICATIONS

JP632287789, Patent Abstract, Semiconductor laser and LED and fabrication thereof, Sep. 22, 1988, Matushita Electric Industrial Co., Ltd, Japan.

KR2000073038, Patent Abstract, Method of making an organic electroluminescent display involving spin coating of an organic insulating material on electrode, Dec. 5, 2001, LG Electronics, Inc., S. Korea.

KR2002000204, Patent Abstract, Method for cleaning electroluminescent display using laser and remote plasma, Jan. 5, 2002, Choi, S. R.

KR2002016127, Patent Abstract, Method for manufacturing organic electroluminescent device, Mar. 4, 2002, Samsung SDI Co, Ltd.

Sze, S. M. (Editor), 9.2.4 Sputter Deposition, VLSI Technology, 358, 1983, McGraw-Hill Book Company.

Wolf, Stanley and Tauber, Richard N., Silicon Processing for the VLSI ERA, vol. 1: Process Technology, 546, 1986, Lattice Press.

Patent Abstracts of Japan, vol. 2003, No. 05, May 12, 2003 & JP 2003 017251 A, Canon Electronics Inc., Jan. 17, 2003, Abstract.

International Search Report Dated: May 31, 2005, International Appln. No. PCT/US2004/023671, International Filing Date: Jul. 22, 2004, 7 pages.

Written Opinion of the International Searching Authority Dated: May 31, 2005, International Appln. No. PCT/US2004/023671, International Filing Date: Jul. 22, 2004, 7 pages.

* cited by examiner

PROCESS FOR REMOVING AN ORGANIC LAYER DURING FABRICATION OF AN ORGANIC ELECTRONIC DEVICE AND THE ORGANIC ELECTRONIC DEVICE FORMED BY THE PROCESS

CROSS REFERENCE TO RELATED APPLICATIONS

This is a Continuation-In-Part of application Ser. No. 10/625,112, filed on Jul. 22, 2003 now U.S. Pat. No. 6,953,705.

STATEMENT AS TO FEDERALLY SPONSORED RESEARCH

This invention was made with Government support under DARPA grant number 4332. The Government may have certain rights in the invention.

FIELD OF THE INVENTION

The invention relates generally to organic electronic devices, and more particularly to processes for removing an organic material from performance sensitive elements during fabrication of an organic electronic device and organic electronic devices formed by the processes.

BACKGROUND INFORMATION

For organic electronic devices, for example organic light-emitting diode displays (OLEDs), the laser ablation process has been used to remove organic materials from unwanted performance sensitive areas of the device. For illustration purposes, for one technique the first steps in the fabrication of OLED devices are the deposition and patterning of the conductive members (e.g., electrodes, such as the anodes) and conductive leads. The anode is typically indium tin oxide (ITO), and the conductive leads may include a tri-layer sandwich including an adhesion layer, a low-resistivity conducting layer, and a protective capping layer. A typical OLED conductive lead structure is Cr/Cu/Cr. After forming the anode and conductive leads, the process involves forming a cathode-separation layer followed by formation of an organic layer, such as a buffer layer (also known as a charge transport layer) (BL) and an electro-luminescent layer (EL), over the entire surface of the substrate. In the current practice in the field, the substrate then goes into the laser ablation system, where the laser beam is focused onto areas that need to be cleared of the organic layer. These include the electrode-to-conductive lead electrical contact pads, bond pads, and the frame (sometimes called the rail) around the active area upon which glue is dispensed for an encapsulating lid, which are examples of the performance sensitive areas of an OLED.

The laser ablation process has serious drawbacks and is a weak link in the fabrication of OLED devices in large volumes. The laser ablation machine is expensive, its modules are difficult to maintain, and the machine as a whole is not easily interfaced with other process tools.

Furthermore, from a materials point of view, the laser ablation process is not well suited to the removal of the organic layer, as it often leaves behind a tough carbonaceous residue that is resistant to removal unless a gas, such as oxygen is added to aid in the formation of volatile oxide species. However, the use of oxygen is risky as the sensitive EL organic active layer is exposed to the atmosphere during the ablation process, which is usually pure nitrogen. The residue problem is mitigated somewhat by using a high laser fluence (measured in mJ/pulse), but the undesirable side effect of this is the cracking of the underlying leads structure. The reliability of the device is thus compromised.

To further complicate the process, the wavelengths of the excimer laser beam available are limited to a few specific values, and so the target organic materials (for example the BL and EL) are forced to have absorption bands in that same wavelength region. This removes an important degree of freedom, and the ablation efficiency is unavoidably compromised.

Towards the end of the ablation process, the conductive leads to which contact is to be made can experience the full brunt of the laser energy, and thus get partly ablated as well. In some cases, the absorption of the laser photons by the conductive leads may be higher than that of the organic layer, in which case the process becomes unusable.

Wet cleaning surfaces with solvents and materials introduces a variety of problems into the manufacturing process of electronic devices.

Thus, improved processes are needed to clean all types of organic materials from performance sensitive areas of an organic electronic device.

SUMMARY OF THE INVENTION

The invention includes an organic electronic device manufactured by the process including the steps of: (a) forming a first conductive member and a conductive lead over a substrate, wherein the first conductive member and conductive lead are spaced apart from each other; (b) forming an organic layer over the substrate, the first conductive member, and the conductive lead; (c) forming a patterned conductive layer over the organic layer, wherein the patterned conductive layer includes a second conductive member, and the patterned conductive layer creates an exposed portion of the organic layer and an unexposed portion of the organic layer; and (d) dry etching at least the exposed portion of the organic layer to expose a portion of the conductive lead using at least one oxygen-containing gas, wherein dry etching is performed at a pressure in a range of approximately 0.01 to 7.5 mTorr.

The invention further includes a process for forming an organic electronic device including the steps of: (a) forming an organic layer including organic material over a substrate; (b) removing the organic layer at a first area of the substrate; and (c) dry etching using at least one oxygen-containing gas the organic layer at a second area of the substrate, wherein removing the organic layer at the first area and dry etching at the second area are performed as separate steps, and dry etching is performed at a pressure in a range of approximately 0.01 to 7.5 mTorr.

BRIEF DESCRIPTION OF THE DRAWINGS

The invention is illustrated by way of example and not limitation in the accompanying figures.

Figure 1:
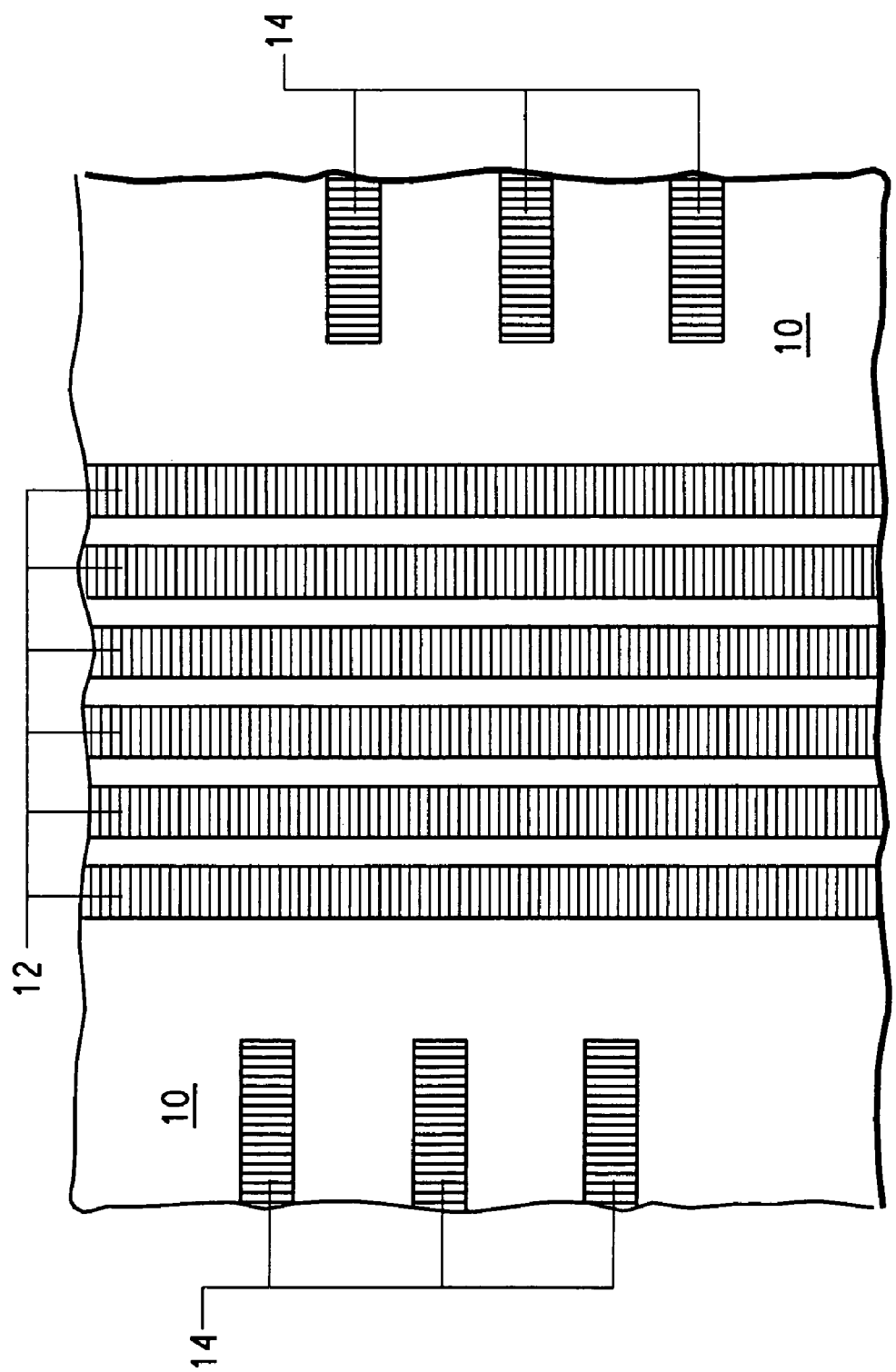
FIG. 1 is a plan view of a portion of a substrate after forming conductive members and conductive leads to the peripheral or remote circuitry.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process has been developed to dry etch an organic layer during the formation of an organic electronic device.

The dry etch can be performed to expose areas of the substrate or other features, particularly those features where subsequent electrical connections or environmental seals are to be made (e.g., conductive leads, bond pads, and the rail). The advantages with using the new process in the production of organic electronic devices is that the dry etching process provides a relatively cleaner and lower cost technique to remove the organic materials, it is easy to maintain the processing equipment, it is compatible with high volume manufacturing, and (optionally) removes the need for laser ablation of conductive leads or wet etching of bond pads. Moreover, the dry etching can be controlled to avoid re-deposition of removed materials, and it provides uniform contact resistance better than encapsulation of the device and other advantages depending on the organic electronic device being constructed and application of the device. Devices manufactured using the new process have shown improvements in performance. For example, in OLED displays, lifetime improvements, device efficiency improvements, and a reduction in leakage current may be observed.

Dry etching of the present invention may be performed as a single step or a multi-step operation and under constant or varied conditions by changing the gases used or varying other operation parameters, such as pressure, power density, temperature, gas flow rates, relative composition of the gases and voltage. If two steps are used, the first step may be performed to remove exposed portions of the organic layer, and the second step may be performed to remove undesired material(s), such as non-volatile etch products and contaminants. Dry etching of the present invention may replace laser ablation and wet etching completely or may be, optionally, used in combination with laser ablation and wet etch techniques currently used in the manufacture of organic electronic devices.

Other features and advantages of the invention will be apparent from the following detailed description, and from the claims.

The detailed description first addresses Definitions followed by the Pre-Dry Etching Processing, Dry Etching, and Post-Dry Etching Processing. Other sections include, Other Embodiments, Advantages, and finally Examples.

1. Definitions

Before addressing details of embodiments described below, some terms are defined or clarified. As used herein, the terms "array," "peripheral circuitry" and "remote circuitry" are intended to mean different areas or components of the organic electronic device. For example, an array may include a number of pixels, cells, or other structures within an orderly arrangement (usually designated by columns and rows). The pixels, cells, or other structures within the array may be controlled locally by peripheral circuitry, which may lie within the same organic electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "organic electronic device" means a device including one or more organic semiconductor layers or materials. Organic electronic devices include: (1) devices that convert electrical energy into radiation (e.g., a light-emitting diode, light-emitting diode display, or diode laser), (2) devices that detect signals through electronic processes (e.g., photodetectors (e.g., photoconductive cells, photoresistors, photoswitches, phototransistors, phototubes, IR detectors), (3) devices that convert radiation into electrical energy (e.g., a photovoltaic device or solar cell), and (4) devices that include one or more electronic components that include one or more organic semiconductor layers (e.g., a transistor or diode).

As used herein, the term "dry etching" means etching that is performed using gas(es). The dry etching may be performed using ionized gas(es) or without using ionized gas(es). Dry etching may be contrasted with "wet etching" in which a liquid is used to etch. More details regarding dry etching are explained later in this specification.

The term "electron withdrawing" is synonymous with "hole injecting." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, hole transport, and their variants will be used.

The term "charge transport material" means a material that can receive a charge and facilitate movement of the charge through the thickness of the material with relative efficiency and small loss of charge.

The term "fluorocarbon gas" means a gas that comprises molecules that include carbon and fluorine. The molecules may or may not include hydrogen, oxygen, nitrogen, or another halogen (different from fluorine). Typically, the fluorocarbon gases used in dry etching do not have more than two carbon atoms, although more carbon atoms could be used if desired.

The term "interhalogen" means a molecular compound consisting of at least two different halogen atoms. Interhalogens include ClF, $ClF_3$, $ClF_5$, $BrF_3$, $BrF_5$, and $IF_5$.

The term "isotropic etch" means an etch that occurs equally in vertical and horizontal directions when looking at a substrate from a cross-sectional view. The term "anisotropic etch" means that an etch occurs only in a vertical direction when looking at the substrate from the The term "low work function material" is intended to mean a material having a work function no greater than about 4.4 eV. The term "high work function material" is intended to mean a material having a work function of at least approximately 4.4 eV.

The term "performance sensitive elements" is intended to mean those aspects, features, or structures of an organic electronic device that affect the electrical or conductive functional performance of the device, device lifetime, the areas that seal the device from environmental influences (including air and moisture), cross-talk of the electrodes and includes, but is not limited to, the conductive leads, pixel array, rails and contact pads.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the *CRC Handbook of Chemistry and Physics*, 81$^{st}$ Edition (2000).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within, for example the organic light-emitting diode display, photodetector, photovoltaic, and semiconductor arts.

2. Pre-Dry Etching Processing

Attention is now directed to details for a first set of embodiments that is described and shown in FIGS. 1–10 in which performance sensitive elements of an organic electronic device are dry etched and particularly using a patterned conductive layer as a mask when dry etching one or more underlying organic materials. Materials currently used in forming the organic electronic devices can be used. Therefore, process development and integration concerns with new materials may be avoided.

The embodiment as illustrated in FIGS. 1–10 may be used for making a monochromatic passive matrix OLED display. Modifications that may be made for use with multi-color or full-color passive matrix and active matrix OLED displays are described later in this specification.

FIG. 1 is a plan view of a portion of a substrate 10. Note that FIG. 1 includes a portion of an array of the OLEDs. Arrays are typically much larger, but a smaller array is described to better illustrate the invention. The substrate 10 can include nearly any type and number of materials including conductive, semiconductive, or insulating materials. If substrate 10 includes a conductive base material, care may need to be exercised to ensure the proper electrical isolation between parts of a component. The conductive base material may be covered by an insulating layer having a sufficient thickness to reduce the effects of parasitic capacitance between overlying electrodes or conductors and the underlying conductive base material.

The substrate 10 may be a glass or a ceramic material (e.g., alumina, or sapphire) or a flexible substrate comprising at least one polymeric film. Examples of suitable polymers for the polymeric film may be selected from one or more materials containing essentially polyolefins (e.g., polyethylene or polypropylene); polyesters (e.g., polyethylene terephthalate or polyethylene naphthalate); polyimides; polyamides; polyacrylonitriles and polymethacrylonitriles; perfluorinated and partially fluorinated polymers (e.g., polytetrafluoroethylene, copolymers of tetrafluoroethylene and polystyrenes); polycarbonates; polyvinyl chlorides; polyurethanes; polyacrylic resins, including homopolymers and copolymers of esters of acrylic or methacrylic acids; epoxy resins; Novolac resins; and any combination thereof. When multiple films are used, they can be joined together with appropriate adhesives or by conventional layer production processes including known coating, co-extrusion, or other similar processes. The polymeric films generally have a thickness in the range of approximately 12–250 microns. When more than one film layer is present, the individual thicknesses can be much less.

Although the polymeric film(s) may contain essentially one or more of the polymers described above, the film(s) may also include one or more conventional additive(s). For example, many commercially available polymeric films contain slip agents or matte agents to prevent the layers of film from sticking together when stored as a large roll.

If the substrate 10 includes a polymeric film, a barrier layer (not shown) may be formed over the substrate 10. The barrier layer can include electrical insulators having an etch rate different from the organic layer that will be subsequently formed and dry etched. The barrier layer can be used as an etch stop and to protect the underlying substrate. Exemplary barrier materials can include $SiO_2$, $Si_3N_4$, insulating metal oxides or nitrides (e.g., $TiO_2$, $Al_2O_3$, $Al_2O_3SiO_2$, $3Al_2O_3.2SiO_2$, AlN) or combinations thereof, and have a thickness in a range of approximately 2–500 nm.

The barrier layer can be formed using plasma enhanced chemical vapor deposition or physical vapor deposition (conventional Radio-Frequency (RF) magnetron sputtering or inductively-coupled plasma physical vapor deposition (ICP-PVD). If the barrier layer is not sufficiently transparent to the radiation to be emitted from or received by the organic electronic device, the barrier layer may be patterned to allow openings at an area where radiation is to pass (e.g., the pixel area for the pixel array).

After reading this specification, skilled artisans appreciate that the selection of material(s) that can be used for the substrate 10 is widely varied. After reading this specification, skilled artisans are capable of selecting the appropriate material(s) based on their physical, chemical, and electrical properties. For simplicity, the material(s) used for this base are referred to as substrate 10.

Conductive members 12 may then be formed over the substrate 10 as shown in FIG. 1. The conductive members 12 can include nearly any conductive material. In this specific embodiment, the conductive members 12 act as anodes for the organic electronic device being formed. In general, the material of the conductive members 12 forms the anodes, which will have a work function relatively higher than subsequently formed conductive members that act as the cathodes. A plurality of conductive layers may be formed to create the conductive members 12. In this particular embodiment, the conductive members 12 lie between the user side of the organic electronic device and the subsequently formed organic active layer. Therefore, conductive members 12 should be transparent to allow the radiation to be transmitted through the conductive member 12. Exemplary materials include ITO, zirconium tin oxide ("ZTO"), elemental metals, metal alloys, and combinations thereof. ITO and ZTO may be thicker when used as the conductive members 12 and still allow sufficient transmission of radiation. For example, when ITO or ZTO are used as the conductive member 12, the conductive members 12 may have a thickness in a range of approximately 100–200 nm. The conductive members 12 are formed using a conventional technique.

Figure 2:
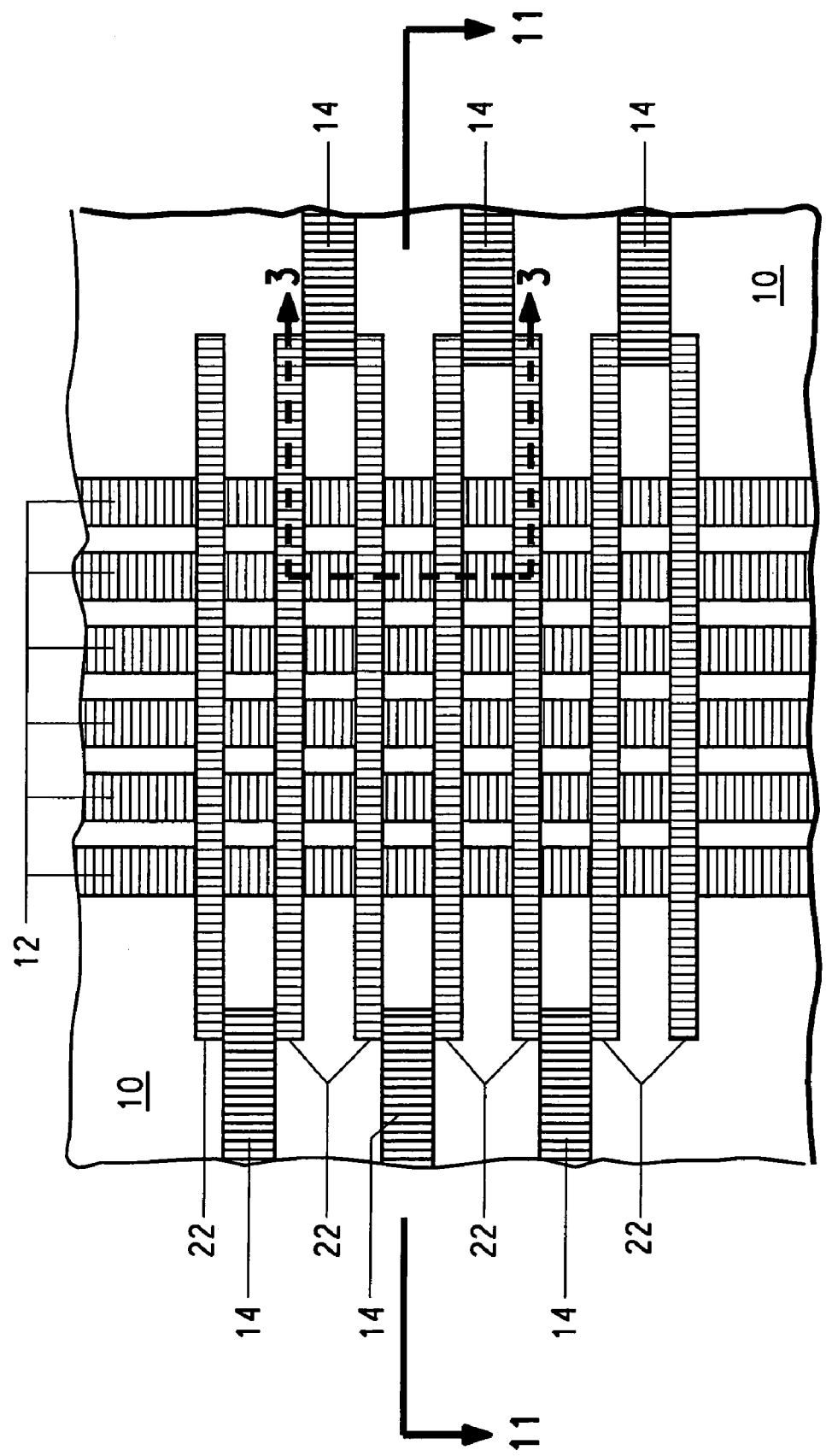
FIG. 2 is a plan view of the substrate of FIG. 1 after forming cathode separation regions.

Conductive leads 14 may be formed to provide electrical connections between subsequently formed conductive members that act as the cathodes in the array and the peripheral and remote circuitry. In FIG. 2, the conductive leads 14 are located near the sides. The conductive members 12 and conductive leads 14 are spaced apart from one another. The significance of the conductive leads 14 with respect to overlying layers will be described later. The conductive leads 14 may be formed using a conventional technique and may comprise one or more layers of Cr, Al, Mo, Cu, Ti, Ta, conductive nitrides, a noble metal (Pt, Pd, or Au), a metal capable of forming a conductive oxide (Ru, Rh, Ir, and Os) or a mixture thereof. In one embodiment, the conductive leads 14 may comprise a plurality of layers including an adhesion layer, a low-resistivity conducting layer, and a protective capping layer. The plurality of layers may be Cr/Al/Cr, Cr/Cu/Cr, or Mo/Cu/Mo. In another embodiment, the uppermost layer of the conductive leads 14 as seen in FIG. 2 may include a noble metal to reduce the likelihood of forming a metal oxide during the dry etching operation described later. In still another embodiment, a metal capable of forming a conductive metal oxide may be used instead of or over the noble metal. The thickness of the conductive leads 14 can be in a range of approximately 10–600 nm. Note that the order in which the leads 14 and conductive members 12 are formed may be reversed in some embodiments.

Although not shown, a layer of electrical insulating material may be formed over the substrate between the conductive members 12 and conductive leads 14. The material may help to electrically isolate conductive members 12 and conductive leads 14, improve planarity of subsequently formed layers, or potentially serve other purposes. The material may be organic or inorganic. The top surfaces of the conductive members 12 within the array should be exposed before forming any other layers within the electronic device.

A cathode-separation layer 22 may be formed by spin coating, casting, or vapor depositing an insulating layer to a thickness of approximately 2–5 µm and patterning the layer to form the structures as illustrated in FIG. 2. Within the array, the cathode-separation layer 22 covers the entire array except where conductive leads 14 are located and conductive members will be subsequently formed. Within the openings, portions of the substrate 10, conductive members 12, and conductive leads 14 are exposed. The peripheral and remote circuitry areas are exposed and are not covered by the cathode-separation layer 22.

The cathode-separation layer 22 may comprise a photo-imageable material including photoresist or polyimide. In one embodiment, a Novolac positive photoimageable resist with image reversal capability may be used.

Figure 3:
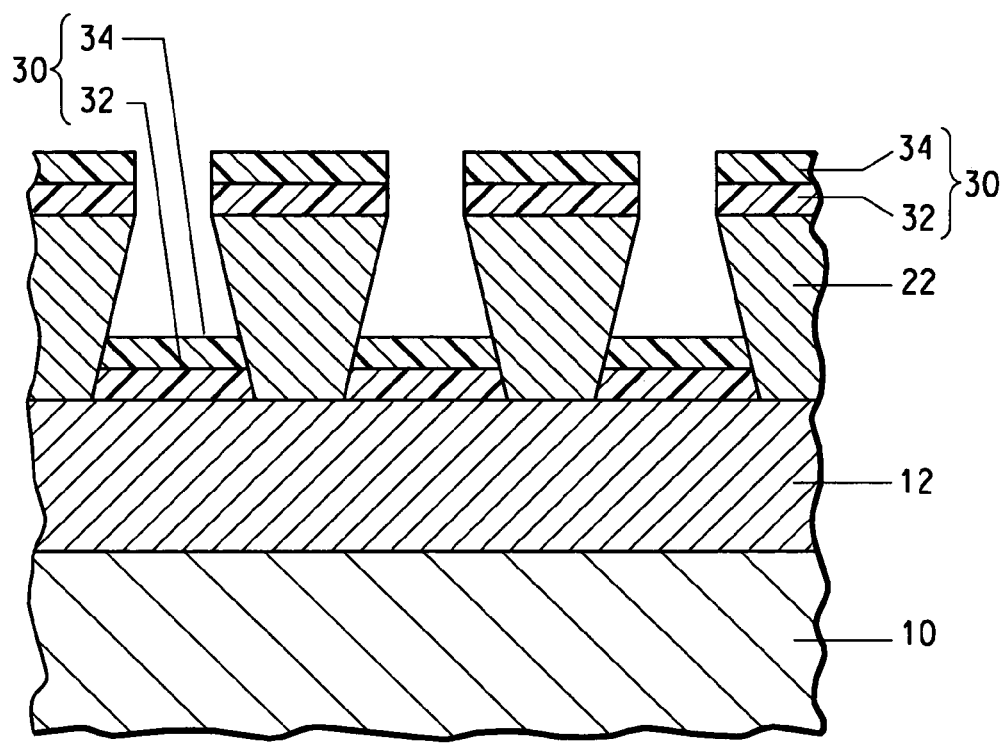
FIG. 3 is a cross-sectional view of a portion of the substrate of FIG. 2 at sectioning lines 3—3 after forming a hole-transport layer and an organic active layer.

An organic material 30 may be formed as shown in FIG. 3. The organic material 30 may include one or more layers. For example, the organic material 30 may include a buffer layer 32 and an organic active layer 34, or the organic layer 34 without the buffer layer 32. Note that buffer layer 32 may overlie or underlie and overlie the organic active layer 34. When the buffer layer 32 lies between the conductive members 12 and the organic active layer, the buffer layer will be a hole-transport layer, and when the buffer layer 32 lies between the organic active layer and subsequently formed conductive members that act as cathodes, the buffer layer will be an electron-transport layer. In another embodiment, buffer layers may lie on both sides of the organic active layer 34. The embodiment as shown in FIG. 3 has the buffer layer 32 that acts as the hole-transport layer. It is further understood that organic material 30 in organic electronic devices may include a variety of organic materials, such as charge transport materials, anti-quenching materials, a variety of active materials (e.g. light-emitters, photodetectors, IR detectors and other radiation sensitive materials).

The buffer layer 32 and the organic active layer 34 are formed sequentially over the conductive members 12, conductive leads 14, and portions of the cathode-separation layer 22. Each of the buffer layer 32 and the organic active layer 34 can be formed by spin coating, casting, or vapor depositing appropriate materials as described below. One or both of the buffer layer 32 and the organic active layer 34 may be cured after it is applied. The organic layer 30 overlies the tops of the cathode-separation layer 22 and along the bottoms of openings within the cathode-separation layer 22, and additionally are present along the walls of the structures in the cathode-separation layer 22. Although not shown in FIG. 3, very thin portions of the organic layer 30 may lie along the sides of the cathode-separation layer 22 at locations above organic layer 30 within the openings. Note that the structures for the cathode-separation layer 22 are narrower near the substrate 10 and wider further from the substrate 10. In another embodiment, the structures may have a more rounded cusp-like or T shape.

In this embodiment, the buffer layer 32 is a hole-transport layer. The hole-transport layer can be used to reduce the amount of damage and potentially increase the lifetime and reliability of the device compared to a device where the conductive members 12 would directly contact the organic active layer 34. In one specific embodiment, the hole-transport layer can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 100–250 nm.

The hole-transport layer typically is conductive to allow electrons to be removed from the subsequently formed active region and transferred to the conductive members 12. Although the conductive members 12 and the optional hole-transport layer are conductive, typically the conductivity of the conductive members 12 is significantly greater than the hole-transport layer.

The composition of the organic actively layer 34 typically depends upon the application of the organic electronic device. When the organic active layer 34 is used in a radiation-emitting organic electronic device, the material(s) of the organic active layer 34 will emit radiation when sufficient bias voltage is applied to the electrical contact layers. The radiation-emitting active layer may contain nearly any organic electroluminescent or other organic radiation-emitting materials.

Such materials can be small molecule materials or polymeric materials. Small molecule materials may include those described in, for example, U.S. Pat. No. 4,356,429 and U.S. Pat. No. 4,539,507. Alternatively, polymeric materials may include those described in U.S. Pat. No. 5,247,190, U.S. Pat. No. 5,408,109, and U.S. Pat. No. 5,317,169. Exemplary materials are semiconducting conjugated polymers. An example of such a polymer is poly (phenylenevinylene) referred to as "PPV." The light-emitting materials may be dispersed in a matrix of another material, with or without additives, but typically form a layer alone. The organic active layer generally has a thickness in the range of approximately 40–100 nm.

When the organic active layer 34 is incorporated into a radiation receiving organic electronic device, the material(s) of the organic active layer 34 may include many conjugated polymers and electroluminescent materials. Such materials include for example, many conjugated polymers and electro- and photo-luminescent materials. Specific examples include poly(2-methoxy,5-(2-ethyl-hexyloxy)-1,4-phenylene vinylene) ("MEH-PPV") and MEH-PPV composites with CN-PPV. The organic active layer 34 typically has a thickness in a range of approximately 50–500 nm.

Although not shown, an optional electron-transport layer may be formed over the organic active layer 34. The electron-transport layer is another example of a buffer layer. The electron-transport layer typically is conductive to allow electrons to be injected from the subsequently formed cathode and transferred to the organic active layer 34. Although the subsequently formed cathode and the optional electron-transport layer are conductive, typically the conductivity of the cathode is significantly greater than the electron-transport layer.

In one specific embodiment, the electron-transport layer can include metal-chelated oxinoid compounds (e.g., $Alq_3$); phenanthroline-based compounds (e.g., 2,9-dimethyl-4,7-diphenyl-1,10-phenanthroline ("DDPA"), 4,7-diphenyl-1,10-phenanthroline ("DPA")); azole compounds (e.g., 2-(4-biphenyl)-5-(4-t-butylphenyl)-1,3,4-oxadiazole ("PBD"), 3-(4-biphenyl)-4-phenyl-5-(4-t-butylphenyl)-1,2,4-triazole ("TAZ"); or any one or more combinations thereof. Alternatively, the optional electron-transport layer may be inorganic and comprise BaO, LiF, or $Li_2O$. The electron-transport layer typically has a thickness in a range of approximately 30–500 nm.

Figure 4:
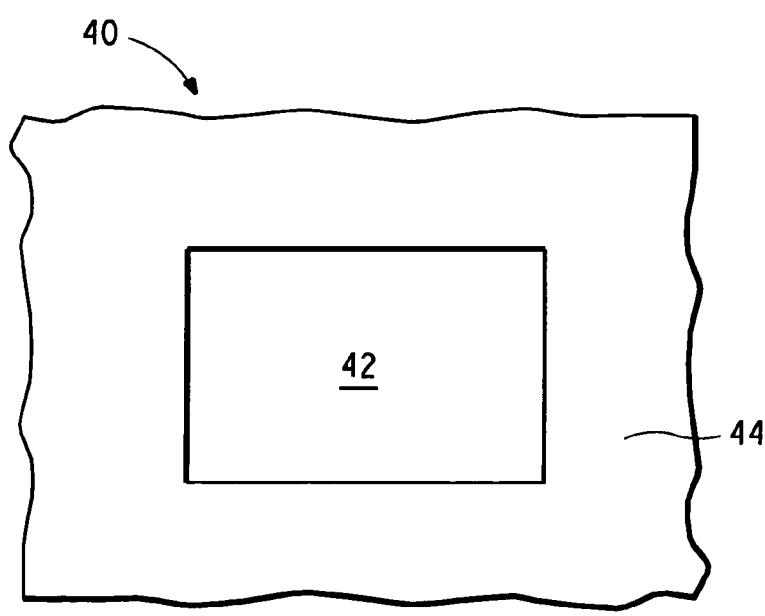
FIG. 4 is a view of a shadow mask used for forming a patterned conductive layer in accordance with an embodiment of the present invention.

FIG. 4 includes an illustration of a portion of a first shadow mask 40 used to form the patterned conductive layer. The first shadow mask 40 includes an opening 42. Portion 44 of the mask 40 comprises a solid material. Opening 42 will be positioned to overlie a portion of the array, and portion 44 will be positioned to overlie other portions of the array and peripheral and remote circuitry areas.

Figure 5:
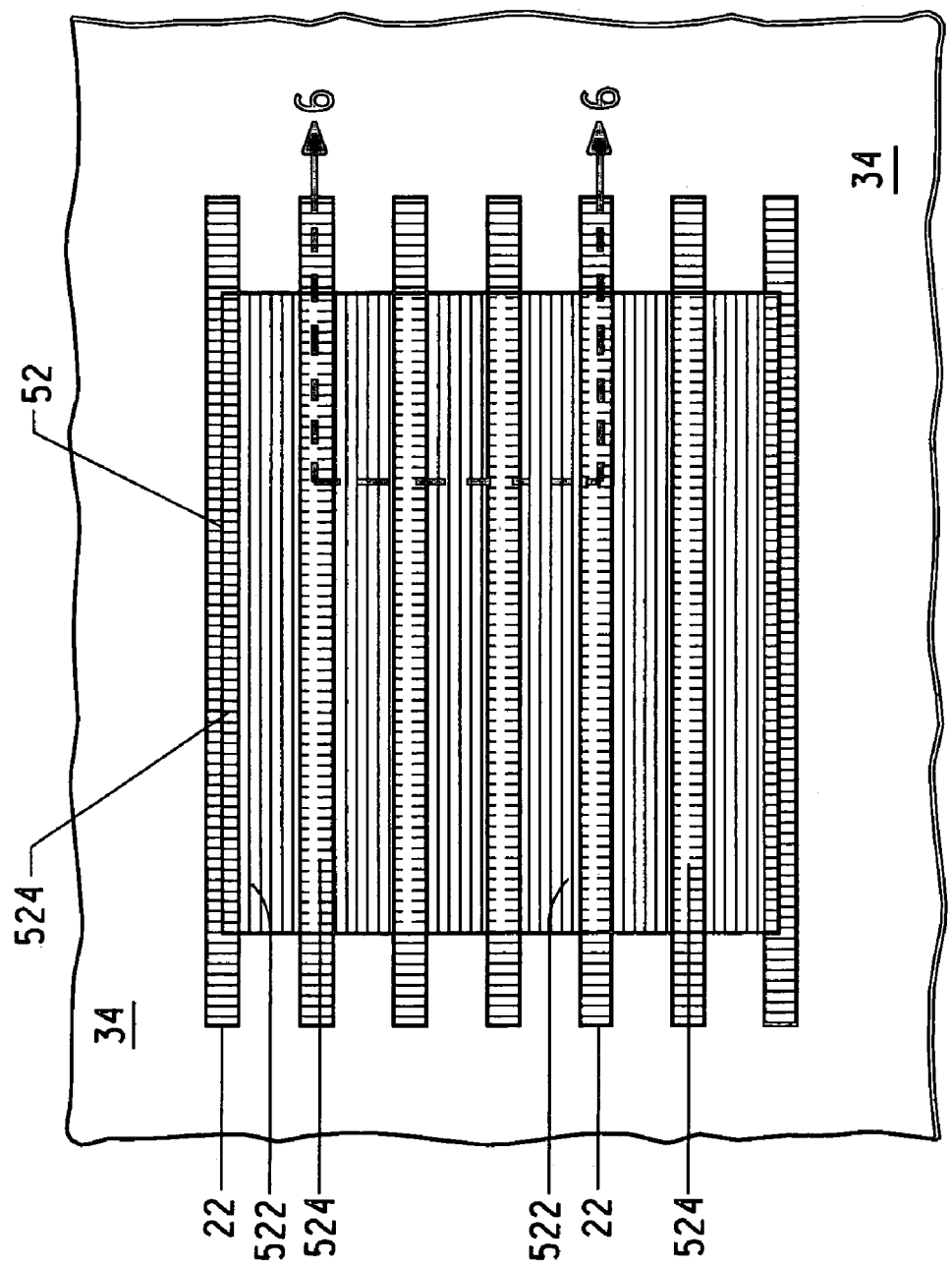
FIG. 5 is a plan view of the substrate of FIG. 2 after forming a patterned conductive layer using the shadow mask of FIG. 4 in accordance with an embodiment of the present invention.
Figure 6:
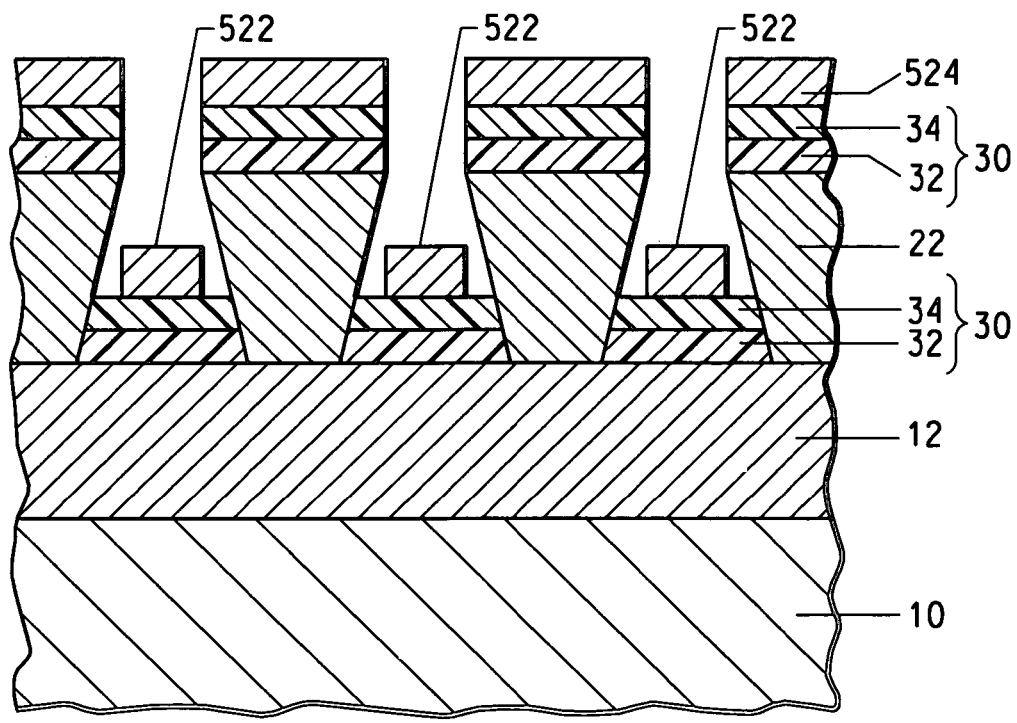
FIG. 6 is a cross-sectional view of a portion of the substrate of FIG. 5 at sectioning lines 6—6 in accordance with an embodiment of the present invention.

As shown in FIGS. 5 and 6, the first shadow mask 40 can be used during deposition to deposit a patterned conductive layer 52 through the opening 42 to form conductive members 522 and 524. Conductive members 522 of the patterned conductive layer 52 act as cathodes and overlie the organic active layer 34 and conductive members 12 as shown in FIG. 6. Conductive members 524 of layer 52 overlie the cathode-separation layer 22 as seen in FIG. 6. The patterned conductive layer 52 may be formed using physical vapor deposition (e.g., evaporation, sputtering). Due to the directional nature of the physical vapor deposition and the shape of the structures within the cathode-separation layer 22, conductive members 522 are not electrically connected to one another or conductive members 524. If the walls of the cathode-separation layer 22 become closer to vertical, an optional collimator may be used during deposition to reduce the likelihood of an unintended electrical short or leakage path between any of the conductive members 522 and 524.

In FIG. 5, portions of the organic active layer 34 are exposed between conductive members 522 and the sides of FIG. 5. Note that conductive leads 14 underlie the organic active layer 34 near the sides of FIG. 5 but are not shown. Likewise, outside the array, portions of the organic active layer 34 overlying the peripheral and remote circuitry areas are exposed, including the rail used for sealing the device.

In general, the patterned conductive layer 52 can comprise a metal-containing layer having a low work function, which is lower than the conductive strips 12 that have a high work function. Materials for the patterned conductive layer 52 can be selected from Group 1 metals (e.g., Li, Cs), the Group 2 (alkaline earth) metals, the rare earth metals including the lanthanides and the actinides. The patterned conductive layer 52 has a thickness in a range of approximately 300–600 nm. In one specific, non-limiting embodiment, a Ba layer of less than approximately 10 nm followed by an Al layer of approximately 500 nm may be deposited. The Al layer may be replaced by or used in conjunction with any of the metals and metal alloys described with respect to the conductive leads 14.

As seen in FIG. 6, the upper surface of the conductive members 522 and 524 will be exposed during substantially all of a subsequent dry etching operation. A layer of a noble metal or a metal capable of forming a conductive metal oxide can be used to lessen adverse effects from using an oxygen-containing gas during the subsequent dry etching operation. Unexposed portions of the organic layer 30 are covered by the conductive members 522 and 524, and exposed portions of the organic layer 30 are not covered by any of the conductive members 522 and 524.

3. Dry Etching

In one embodiment, the method of dry etching performance sensitive elements of an organic electronic device comprises the steps of (a) placing at least one performance sensitive element on the substrate spaced apart from a first conductive member, wherein at least one of the performance sensitive elements are a conductive lead; (b) placing organic material on the performance sensitive element and the first conductive member; (c) forming a patterned conductive layer over the organic material exposing a predetermined portion of the performance sensitive elements; and (d) dry etching the organic material in the exposed areas of the performance sensitive elements using at least one oxygen-containing gas.

In one embodiment of the present invention, performance sensitive elements of an organic electronic device are cleaned of any organic material using a dry etch process for forming an organic electronic device comprising the steps of: forming a first conductive member and a conductive lead over a substrate, wherein the first conductive member and conductive lead are spaced apart from each other; forming an organic layer over the substrate, the first conductive member, and the conductive lead; forming a patterned conductive layer over the organic layer, wherein: the patterned conductive layer includes a second conductive member; and the patterned conductive layer creates an exposed portion of the organic layer and an unexposed portion of the organic layer; and dry etching, using at least one oxygen-containing gas, the exposed portion of the organic layer to expose a portion of the conductive lead.

In another embodiment of the present invention, performance sensitive elements of an organic electronic device are cleaned of any organic material using a dry etch process for forming an organic electronic device comprising the steps of: forming a first conductive member and a conductive lead over a substrate, wherein the first conductive member and conductive lead are spaced apart from each other; forming an organic layer over the substrate, the first conductive member, and the conductive lead; forming a patterned conductive layer over the organic layer, wherein: the patterned conductive layer includes a second conductive member; and the patterned conductive layer creates an exposed portion of the organic layer and an unexposed portion of the organic layer; and dry etching, using at least one oxygen-containing gas, the exposed portion of the organic layer to expose a portion of the conductive lead, wherein the dry etching is performed at a pressure in a range of approximately 0.01 to 7.5 mTorr.

In another embodiment of the present invention, a process for forming an organic electronic device includes a step of forming a first conductive member and a conductive lead over a substrate. The first conductive member and conductive lead are spaced apart from each other. The process also includes a step of forming an organic layer over the substrate, the first conductive member, and the conductive lead. The process further includes a step of forming a patterned conductive layer over the organic layer. The patterned conductive layer includes a second conductive member and creates an exposed portion of the organic layer and an unexposed portion of the organic layer. The process still further comprises dry etching, using at least one oxygen-containing gas, the exposed portion of the organic layer to expose a portion of the conductive lead.

In another embodiment of the present invention, the process features steps of forming a conductive lead over the substrate, forming an organic layer over the conductive lead, and forming a first conductive member over the organic layer. The first conductive member is spaced apart from the conductive lead, and an exposed portion of the organic layer is not covered by the first conductive member. The process also includes steps of dry etching, using at least one oxygen-containing gas, the exposed portion of the organic layer and forming a second conductive member after dry etching. The second conductive member overlies and is electrically connected to the first conductive member and the conductive lead.

In still a further embodiment of the present invention, the process features the steps of forming an organic layer over a substrate, removing the organic layer at an area of the substrate, and dry etching the organic layer at a different area of the substrate. The steps of removing and dry etching are performed separately. In a specific embodiment, the step of removing may be performed using laser ablation. Also, one of the areas may correspond to the pixel array and the other area lies outside the pixel array.

In still a further embodiment of the present invention, the process features the steps of forming an organic layer over a substrate, removing the organic layer at an area of the substrate, and dry etching the organic layer at a different area of the substrate. The steps of removing and dry etching are performed separately, and dry etching is performed at a pressure in a range of approximately 0.01 to 7.5 mTorr. In a specific embodiment, the step of removing may be performed using laser ablation. Also, one of the areas may correspond to the pixel array and the other area lies outside the pixel array.

The dry etching may be performed during a first step, a second step, or in two or more steps. The conditions of the dry etch process need not remain uniform throughout the operation of the dry etching. Rather, gas mixtures, gas pressures, voltage, power density and temperature may vary over time during dry etching. The dry etching process may include discrete steps having well-defined starting and stopping points and may include various steps within one continuous operation having only one initial starting and stopping only upon completion of dry etch task. Use of the "step" or "steps" is meant to include both those uses having discrete starts and stops and a single dry etch process where conditions are varied at least once during one continuous operation.

The organic materials may be removed during the first step, and an undesired material, such as a non-volatile material, may be removed during the second step. At least one oxygen-containing gas must be in the gas used during the first step. Exemplary oxygen-containing gases include $O_2$, $COF_2$, $CO$, $O_3$, $NO$, $N_2O$, and mixtures thereof. At least one halogen-containing gas may also be used during the first step in combination with at least one oxygen-containing gas. The halogen-containing gas can include any one or more of a fluorine-containing gas, a chlorine-containing gas, a bromine-containing gas, or an iodine-containing gas and mixtures thereof.

When a fluorine-containing gas is used, it may include any one or more fluorocarbon gases, which may or may not be saturated and may or may not include other halogen atoms, $F_2$, $HF$, $SF_6$, $NF_3$, metal fluorides ($WF_6$, $MoF_6$, $TaF_5$), fluorine-containing interhalogens (ClF, $ClF_3$, $ClF_5$, $BrF_3$, $BrF_5$, and $IF_5$), and mixtures thereof. The chlorine-containing gases may be selected from a group consisting of chlorocarbons which may or may not be saturated and may or may not include other halogen atoms (e.g., F, Br, and I), $Cl_2$, HCl, $BCl_3$, metal chlorides ($TiCl_4$, $TaCl_5$, $MoCl_5$, and $WCl_5$), chlorine-containing interhalogens (ClF, $ClF_3$, and $ClF_5$), and mixtures thereof. The bromine-containing gas may be selected from a group consisting of bromocarbons which may or may not be saturated and may or may not include other halogen atoms (e.g., F, Cl, and I), $Br_2$, HBr, $BBr_3$, bromine-containing interhalogens ($BrF_3$ and $BrF_5$), and mixtures thereof. The iodine-containing gas may be selected from a group consisting of iodocarbons which may or may not be saturated and may or may not include other halogen atoms (e.g., F, Cl, and Br), $I_2$, HI, metal iodides, iodine-containing interhalogens ($IF_5$), and mixtures thereof.

In one embodiment, the halogen-containing gas may be a fluorine-containing gas. In another embodiment, the fluorine-containing gas may include a fluorocarbon which may or may not be saturated and may or may not include other halogen atoms. In still another embodiment, the fluorocarbon may have a formula $C_aF_bH_c$, wherein a is 1 or 2, b is at least one, and b+c is 4 if a is 1 and is 4 or 6 if a is 2. $CF_4$ is an exemplary fluorocarbon gas.

While metal halide gases may be used, care may be needed to allow the etch to be performed without depositing the metal from the metal halide gas. Along similar lines, care may be needed when halogens other than fluorine are used because the other halogens typically have poorer selectivity to metal-containing materials and are used as metal-etching gases.

An inert or a reducing gas may be used with the other gases during one or both of the first and second dry etching steps. The inert gas may include any one or more of a noble gas, $N_2$, and mixtures thereof, and the reducing gas may include any one or more of $H_2$, $NH_3$, $N_2H_4$, $N_2H_2$, and mixtures thereof.

The inert gas can be used to help physically remove non-volatile etch products or contaminants. In still another embodiment, a reducing gas may be added to help reduce any metal oxide that may form to its corresponding metal (e.g., $Al_2O_3$ reduced to Al). The reducing gas can be selected from a group consisting of $H_2$, $NH_3$, $N_2H_4$, and $N_2H_2$ and mixtures thereof. Note that hydrogen may also be produced when a fluorocarbon gas having at least one hydrogen atom is used. If sidewall polymer formation is to be avoided, the reducing gas may not be used. In one specific embodiment, gases used during the first dry etching step may consist essentially of a mixture of $O_2$, $CF_4$, and Ar and the gas of the second dry etching step may consist essentially of Ar. The dry etching may be performed at a power density in a range of approximately 10 to 5000 mW/cm$^2$ and at a pressure in a range of approximately 0.01 to 5000 mTorr. The temperature can vary, depending on the performance sensitive element and the organic material to be removed. The dry etch is typically performed at a temperature not above about 80° C.

In still another embodiment of the present invention, the organic electronic device may include first conductive members (acting as anodes), an organic layer and second conductive members (acting as cathodes). After forming the first conductive members, conductive leads, and the organic layer over a substrate, the process includes a step of forming a patterned first conductive layer over the organic layer. The patterned first conductive layer includes the second conductive members. The patterned first conductive layer is formed using a shadow mask during a physical vapor deposition. Exposed portions of the organic layer are not covered by the patterned first conductive layer. The process also includes a step of dry etching the exposed portions of the organic layer to expose portions of the conductive leads. Dry etching is performed using the two-step dry etching sequence described above. The process further includes a step of forming a patterned second conductive layer over the patterned first conductive layer. The patterned second conductive layer is formed using a different shadow mask during a physical vapor deposition. The patterned second conductive layer includes third conductive members, wherein each of the third conductive members overlies substantially all of a corresponding second conductive member and overlies a portion of one of the conductive leads. Each of the third conductive members contacts the corresponding second conductive member and one of the conductive leads and extends into the opening.

Another embodiment of the present invention includes an organic electronic device including a conductive lead, an organic layer, a first conductive member overlying the organic active layer, and a second conductive member. A side of the first conductive member closest to the conductive lead and a side of the organic layer closest to the conductive lead are substantially coterminous with each other. From a plan view, the conductive lead and the first conductive member are spaced apart from each other. The second conductive member electrically connects the first conductive member to the conductive lead.

The composition of some of the materials may be varied. For example, the substrate may include a polymeric film, and the organic layer includes a buffer layer and an organic active layer.

The embodiments of the present invention may be used in a variety of different organic electronic devices including light-emitting displays, radiation sensitive devices, photoconductive cells, photoresistors, photoswitches, photodetectors, phototransistors, and phototubes. Alternatively, the organic electronic devices may include displays, detectors, and voltaic cells that may be designed to operate within the visible light spectrum or outside the visible light spectrum.

The foregoing general description and the following detailed description are exemplary and explanatory only and are not restrictive of the invention, as defined in the appended claims.

Figure 7:
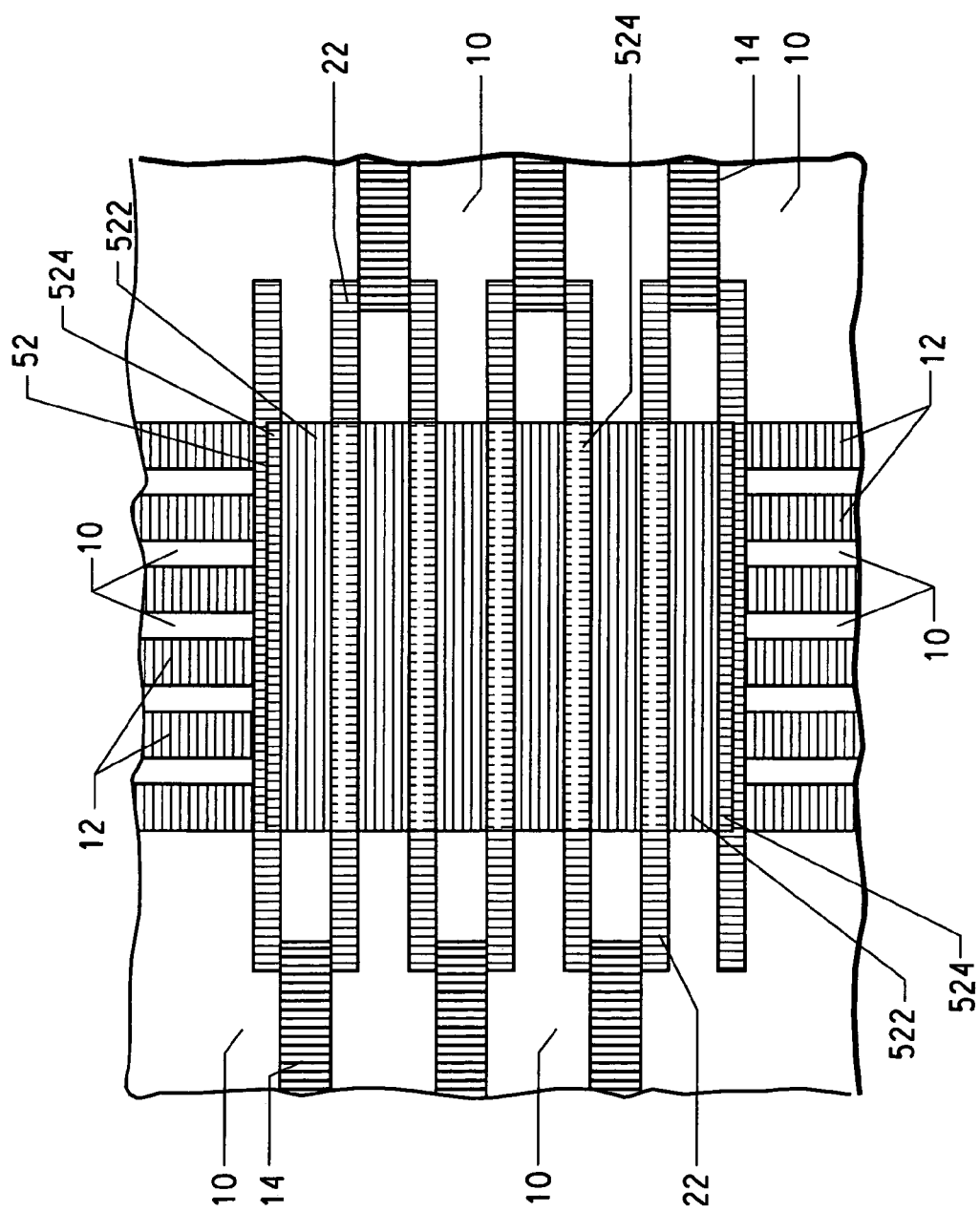
FIG. 7 is a plan view of the substrate of FIG. 5 after dry etching portions of the hole-transport layer and organic active layer in accordance with an embodiment of the present invention.

Dry etching can be performed to remove exposed portions of the organic layer 30. After the dry etching is performed, portions of the substrate 10, conductive members 12 that are not covered by the patterned conductive layer 52, and conductive leads 14 can be exposed as shown in FIG. 7. The dry etching may be performed using one or more steps. In one embodiment, the dry etching may be performed using a first step to remove the organic layer 30 and a second step to remove undesired material(s), such as non-volatile etch products and contaminants. If the upper surface of the conductive members 522 do not form an insulating oxide, and if the organic layer 30 does not contain any significant amount of non-volatile contaminants (e.g., sodium, silicon, sulfur, etc.), a single step may be used. However, in another embodiment, the upper surface of the conductive members 522 may form an insulating oxide or the organic layer 30 may contain a significant amount of non-volatile etch products or contaminants. A two step process may be used. The first step removes substantially all of the organic layer 30, and the second step is performed to remove undesired materials, such as non-volatile etch products and contaminants. The first step is to remove the organic layer 30 while still maintaining good selectivity to other materials that are or may become exposed during the first step. Selectivity is a measure usually expressed as a ratio or fraction of the etch rate of the targeted material to be removed (the organic layer 30 in this embodiment) to the etch rates of the other materials that are or become exposed during the first step. Higher selectivity is desired but may be limited by other considerations, such as equipment throughput and diminished anisotropic character of the etch if an anisotropic etch is desired. Also, with a plurality of different materials exposed near the end of the first step, while the selectivity of the organic layer 30 to conductive members 522 is optimized, the selectivity of the organic layer 30 to the cathode-separation layer 22 may be too low. The selectivity is typically a function of the etch chemistry used. The etch chemistries are discussed in more detail below.

The conductive members 522 and 524 are exposed during substantially all of the first step. The conductive leads 14, the substrate 10 (or its barrier layer, if present) become exposed after the organic layer 14 is removed. The sides of the cathode-separation layer 22 are exposed during substantially all of the first etch. Portions of the cathode-separation layer 22 are not covered by the patterned conductive layer 52. The upper surface of such portions become exposed after the organic layer 30 is removed.

The ratio of the feed gases during the first step may be selected in part to achieve the desired selectivities. In one embodiment, the oxygen-containing gas is about 1 to 100 volume percent of the feed gas, the halogen-containing gas is 0 to 50 volume percent, the inert gas is 0 to 40 volume percent, and the reducing gas is 0 to 30 volume percent. In another embodiment, the oxygen-containing gas includes $O_2$ and is 30 to 95 volume percent of the feed gas, the halogen-containing gas includes a fluorocarbon and is 1 to 30 volume percent, and the inert gas may be selected from a group consisting of $N_2$, He, and Ar and is 4 to 30 volume percent, and the reducing gas may be selected from a group consisting of $H_2$ and $NH_3$ and is 0 to 10 volume percent. In still a further embodiment, the oxygen-containing gas is $O_2$ and is 60 to 95 volume percent of the feed gas, the halogen-containing gas is $CF_4$ and is 4 to 20 volume percent of the feed gas, the inert gas is Ar and is 10 to 20 volume percent of the feed gas, and no reducing gas is used.

The operating parameters may vary depending on the type of reactor used, size of the etching chamber, or the size of the substrate being etched. A batch etching system, such as a barrel etcher (sometimes also referred to as an asher) and a hexode reactor, may be used. Alternatively, a single substrate system, such as one with planar parallel plates may be used. During the etching, the plasma may be directly exposed to the substrate or a downstream plasma may be used. In a downstream plasma, the plasma is generated at a location that is removed from the substrate. Recombination of the ions and electrons occurs just outside the plasma zone. Long-lived metastable radicals arrive at the substrate located further downstream from the recombination zone, and promote etching. The advantage of downstream plasmas is that ion and electron induced damage is eliminated. UV light can also be excluded if necessary by using for example an elbow pipe to prevent line of sight UV radiation from impinging on the substrate. The plasma itself can be generated using inductive coupling or microwave energy in a standing wave quarter wave cavity. Other generation methods are possible.

At the beginning of the first step, the substrate 10 may be loaded into the dry etching system. The feed gas(es) flow into the dry etching chamber and the pressure is allowed to stabilize. The pressure is in a range of approximately 0.01 to 5000 mTorr. At these pressures, the feed gas(es) may flow at a rate in a range of approximately 10 to 1000 standard cubic centimeters per minute ("sccm"). In another embodiment, the pressure may be in a range of approximately 0.01 to 7.5 mTorr, the feed gas(es) may flow at a rate in a range of approximately 100 to 500 sccm. In still a further embodiment, the pressure may be in a range of approximately 1 to 7.5 mTorr.

The voltage and power may be applied to generate a plasma. Power is typically a linear or near linear function of the surface area of the substrate. Therefore, power densities (in power per unit area of substrate) are given. The voltage is in a range of approximately 10 to 1000 V. and the power density is in a range of approximately 10 to 5000 mW/cm$^2$.

The lower limits on voltage and power density may cause the plasma to be difficult to sustain or produce unacceptably low etch rates. The upper limits on voltage and power density may be too aggressive and cause the dry etching to be uncontrollable, irreproducible (important in manufacturing), or have unacceptably low selectivity. In one embodiment, the voltage may be in a range of approximately 20 to 300 V, and the power density may be in a range of approximately 50 to 500 mW/cm$^2$. The ramp rate of the voltage and power may be quite high because the voltage and power are typically turned on and off similar to a conventional light switch.

The first step may be performed for a set time, using endpoint detection or a combination of endpoint detection and a set time for the overetch. If the first step is too short, not all of the conductive leads 14 will be exposed causing an open circuit or highly resistive circuit to be formed in a finished device. If the first step is too long, too much of the cathode-separation layer 24 that is not covered by the patterned conductive layer 52 may be etched, particularly the wider portions of the cathode-separation layer 24 and may lead to an electrical short or a leakage path. In addition, if the first step is too long, the conductive leads 14, conductive members 522, and substrate 10 may become pitted, or in the case of the conductive leads 14 and conductive member 522, may cause unacceptably high contact resistance to subsequently formed conductive members.

In one embodiment, the gases, their pressure, the flow rate, power density, and voltage may be varied over time during the dry etch processes.

When a set time is used for the first step, the time may be in a range of approximately 2 to 30 minutes for a batch reactor. In another embodiment, the set time may be in a range of approximately 5 to 10 minutes for the batch reactor. For a single-substrate dry etching chamber, the etching time may be less than half the time or shorter than the times previously given. In a further embodiment, etch times may be in a range of approximately 0.1 to 5 minutes. In still a further embodiment, etch times may be in the range of approximately 0.5 to 3 minutes. Endpoint detection may be performed using a conventional technique.

The second step may be performed using an inert gas, and optionally a reducing gas, both of which are described above. The inert gas helps to remove undesired materials left after the first step, and the reducing gas may help to reduce a metal oxide formed during the first step to its corresponding metal. In one embodiment, the second step includes the inert gas at 50 to 100 volume percent, and the reducing gas at 0 to 50 volume percent. In another embodiment, the second step includes the inert gas at 70 to 100 volume percent and the reducing gas at 0 to 30 volume percent. In still a further embodiment, the inert gas is Ar at 90 to 100 volume percent, and the reducing gas is $H_2$ at 0 to 10 volume percent.

The operating conditions during the second step lie within the widest ranges given above for the first step. The actual operating conditions used during the second step may be different from the first step. For example, the voltage and power density may be higher because the undesired materials are being physically removed as opposed to chemically etched. During the second step, the voltage may be in a range of approximately 10 to 600 V, and the power density may be in a range of approximately 100 to 1000 mW/cm$^2$. If the voltage or power density is too high, the second step may remove too much of the underlying materials, may be uncontrollable or irreproducible. The second step is typically performed as a timed etch. After the second step, the voltage, power, and feed gases are turned off. The dry etching chamber is pumped down and purged. After purging, the dry etching chamber is vented to approximately atmospheric pressure and the substrate is removed.

After the etching operation is completed, portions of the substrate 10 (or barrier layer, if present) and conductive leads 14 are visible as seen in FIG. 7. Although not shown in FIG. 7, other portions of conductive leads or conductive members formed before the organic layer 30 (e.g., formed simultaneously with conductive members 12 or conductive leads 14) may become exposed. The organic layer 30 is removed from the peripheral and remote circuitry areas. One of those areas includes the rail, which is the area where a subsequently formed encapsulation layer is attached. Exposed portions of conductive members or leads not shown in FIG. 7 may correspond to bond pads to allow electrical connections to be made to the circuits on or within the substrate 10.

While many different gases and operation conditions have been described with respect to the dry etching, the dry etching should be as gentle as possible while still maintaining acceptable etch rates and removal of undesired materials. Organic electronic devices tend to be more sensitive to processing conditions compared to their inorganic electronic device counterparts.

Any number of commercially available dry etching systems are suitable for use with the present invention, including the Plasma Therm 790 Series from Unaxis and the March PX-500 from March Plasma Systems. In typical capacitively-coupled plasma etchers, called reactive ion etchers (RIE), the pressure range of operation is between 100 mTorr and 1 Torr. To operate at lower pressures, down to 1 mTorr, the applied power needed would be very high, with an attendant high sheath voltage. This causes severe ion bombardment of the substrate surface. To decouple the bias voltage on the substrate from the applied power needed to create and maintain the plasma, inductively-coupled plasma (ICP) systems become necessary. In ICP systems, the plasma is generated via a resonant inductive coil in an upper section of a chamber. Below, in the same chamber, the substrate is placed on a pedestal, which can be powered separately using another power supply. A set of solenoids can also be used in the upper chamber to confine the electrons and adjust the conductivity of the plasma, producing a uniform plasma in the upper chamber at pressures in the range 1 to 50 mTorr. The degree of ionization and activation can be very high, producing a very reactive plasma. In the lower chamber, the substrate pedestal can either be unpowered or powered, depending on the sheath voltage desired.

Other low pressure plasma generation techniques used in plasma etching are microwave cavities and microwave electron cyclotron resonance (uECR). ECR plasmas operate even below 1 mTorr, and ionization efficiencies are again very high, due to the resonance between the cyclotron frequency of the electron and the microwave excitation field. The substrate can also be independently biased using a power supply for increasing ion bombardment as desired.

Helicon plasma sources are also used in low pressure etching. In this case radio frequency waves are generated from an antennae. A solenoid magnetic field is also applied in addition to the RF field. Right hand circularly polarized helicon waves at a smaller wavelength than the RF waves pass through the plasma and ionize the gas.

Ion beam etching, typified by ion milling, reactive ion milling, and Gas Cluster Ion Beam (GCIB) etching are also low pressure (sub mTorr to a few mTorr) etching methods using ions extracted from a plasma. In the case of GCIB, the source of the clusters is a expanding gas, which is ionized and then accelerated towards the substrate.

Plasma enhancement can be carried out by with a magnetron assist, laser assist, and triode assist. These methods provide for a lower pressure operation and more uniform etching.

Plasma etching as embodied in the inventive process can be extended to include any of these manifestations of the plasma, down to sub-millitorr pressure range.

4. Post-Dry Etching Processing

Figure 8:
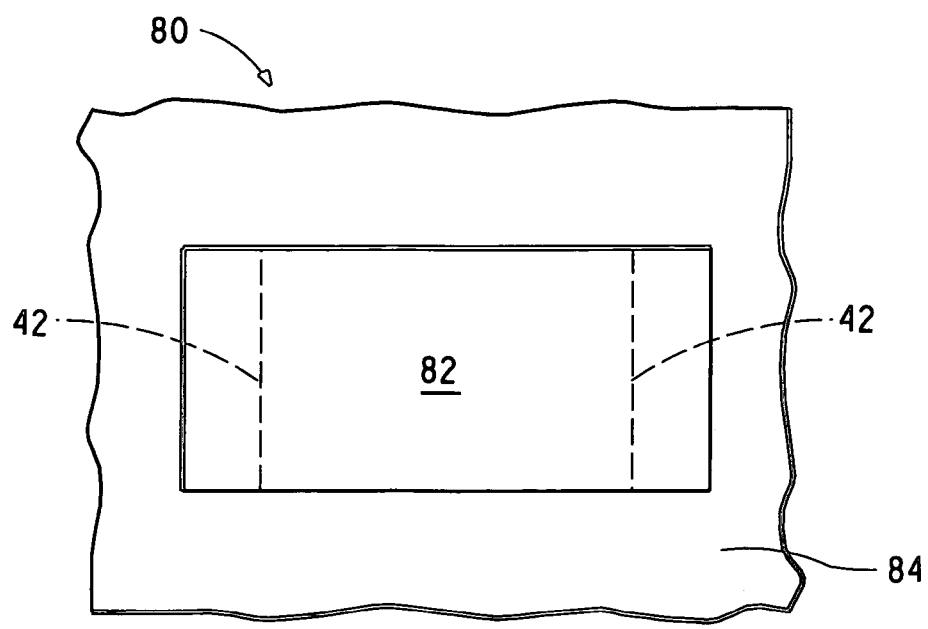
FIG. 8 is a view of a shadow mask used for forming a second conductive layer for a conductive member in accordance with an embodiment of the present invention.

A patterned conductive layer is formed using a second shadow mask 80 as shown in FIG. 8 that has a pattern different from the pattern of the first shadow mask 40. The opening 82 corresponds to an area where conductive members are subsequently formed. The opening 82 is similar to opening 42 except that it is longer in the direction parallel to the lengths of the conductive members 522 and 524 when seen from a plan view of the organic electronic device. Dashed lines 42 correspond to the lateral edges of the opening in mask 40. Note that the dashed lines are only used for a reference, as no material is present within opening 82. The width of opening 82, in the direction perpendicular to the lengths of the conductive members 522 and 524, may be substantially the same or narrower than opening 42. The significance of the length of opening 82 will be addressed later in this specification. Solid material 84 is used to substantially prevent any material from being deposited over undesired portions of the substrate 10. In peripheral and remote circuitry areas, openings (not shown) are present and used to electrically connect the array and circuits outside the array to one another.

Figure 9:
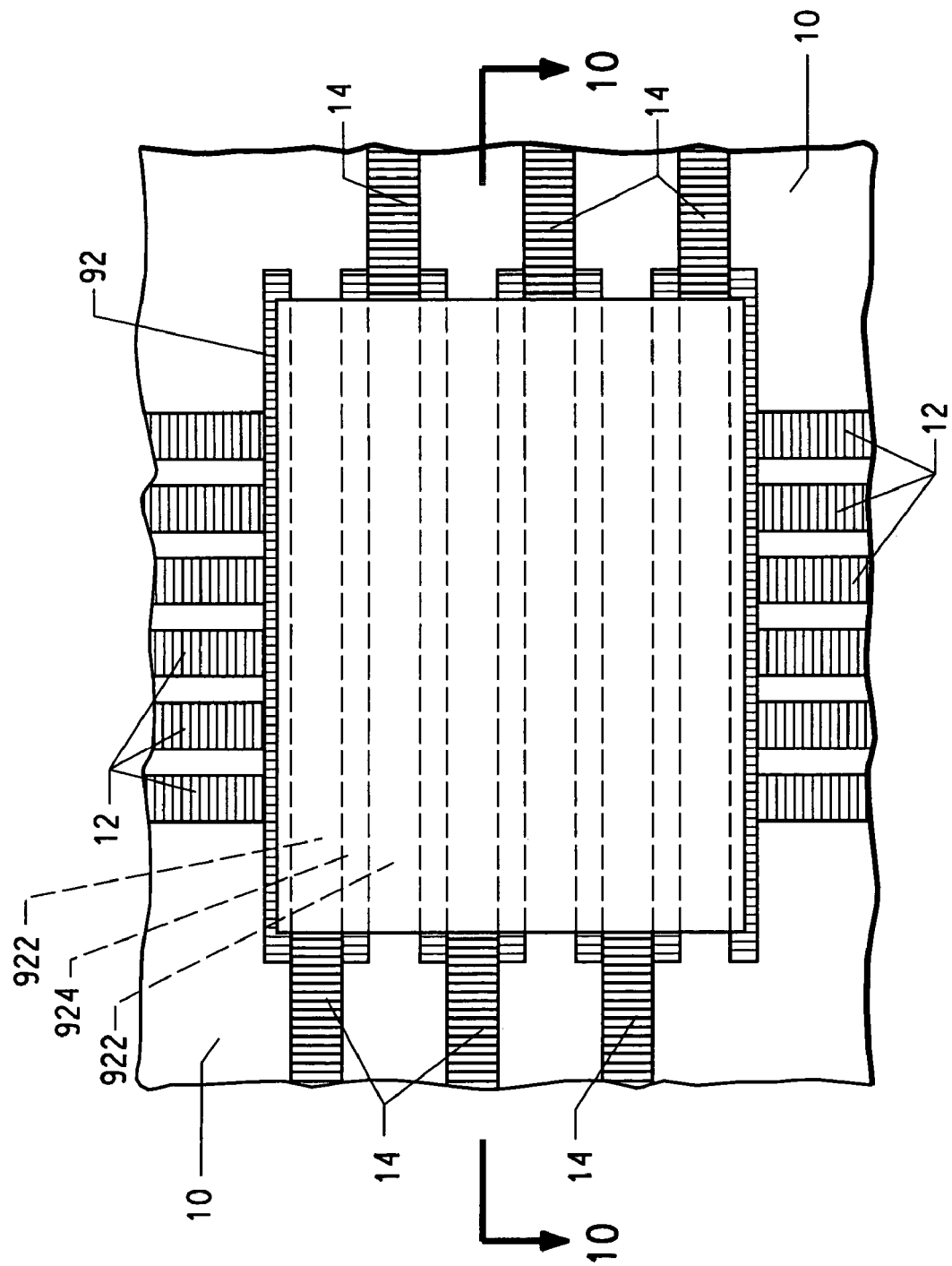
FIG. 9 is a plan view of the substrate of FIG. 7 after forming a patterned conductive layer using the shadow mask of FIG. 8 in accordance with an embodiment of the present invention.
Figure 10:
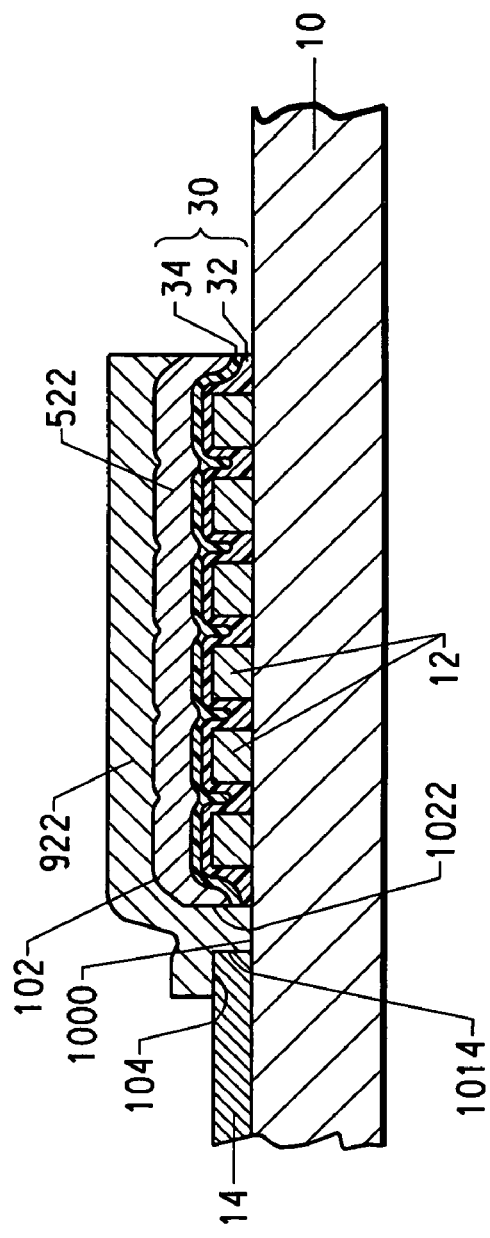
FIG. 10 is a cross-sectional view of the substrate of FIG. 9 at sectioning lines 10—10 after forming the patterned conductive layer.

After the second mask 80 is aligned to the substrate 10, a patterned conductive layer 92 is formed using physical vapor deposition (e.g., evaporation or sputtering) to give the structures within the array as illustrated in FIGS. 9 and 10. The patterned conductive layer 92 may include any one or more of the materials or layers described with respect to the conductive leads 14 and the conductive members 14, 522, and 524. The thickness may be in a range of 50–1000 nm. In one specific, non-limiting embodiment, an Al layer having thickness in a range of approximately 100–300 nm may be deposited.

FIG. 9 includes a plan view of the patterned conductive layer 92. The conductive members 922 lie between the cathode separation structures. Conductive member 924 overlies the cathode-separation layer 22 and is spaced apart from the conductive members 922. Referring to FIG. 5, the conductive members 922 would be deposited onto conductive members 522 and portions of conductive leads 14, and conductive member 924 would be deposited onto conductive member 524. The directional nature used for forming the patterned conductive layer 52 should be used for the patterned conductive layer 92. In this manner, electrical shorts or leakage paths are not formed.

Each pixel is defined by the area in which a conductive member 12 and a conductive member 522 intersect as seen from a plan view of the substrate 10. Note that, cumulatively, the conductive members 922 overlie substantially all of that (pixel) area.

FIG. 10 includes an illustration of a cross-sectional view of FIG. 9 at sectioning line 10—10. The conductive member 922 overlies substantially the entire conductive member 522 at interface 102. Because the conductive member 922 is longer than the conductive member 522, member 922 also contacts conductive lead 14 at interface 104. Therefore, conductive member 922 forms a conductive bridge that electrically connects and contacts its corresponding conductive member 522 and conductive lead 14. Relatively low contact resistances may be realized at the interfaces 102 and 104 because the surfaces of the conductive leads 14 and conductive members 522 are not damaged as much as they would be were laser ablation used. Exposed portions of conductive members and conductive leads within peripheral and remote circuitry areas (not shown) are likewise not damaged, and therefore, contacts to other portions of the subsequent conductive members or wire bonds (not shown) will likewise have good contact resistance characteristics.

Other features shown in FIG. 10 are noted. An opening through the organic layer 30 (including organic active layer 34 and hole-transport layer 32) is seen in FIG. 10. A side of the conductive member 522 is substantially coterminous with underlying side of the organic layer 30 (illustrated by side 1022 in FIG. 10). Conductive lead 14 has a side 1014 that faces side 1022. Note that a portion of the conductive member 922 extends into the opening in the organic layer 30, and in this particular embodiment, contacts the sides 1014 and 1022 and the substrate 10 at surface 1000.

Other circuitry not illustrated in FIGS. 1–10 may be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe), or sense amplifiers.

An encapsulating layer (not shown) can be formed over the array and the peripheral and remote circuitry to form a substantially completed electrical component, such as an electronic display, a radiation detector, and a voltaic cell. The encapsulating layer may be attached at the rail such that no organic layers lie between it and the substrate 10. Radiation may be transmitted through the encapsulating layer. If so, the encapsulating layer should be transparent to the radiation.

5. Other Embodiments

In another embodiment, a full-color active matrix display may be formed. An insulating layer of organic well structures may be sequentially formed after forming the conductive members 12 and conductive leads 14. Also, portions of the organic active layer 34 may selectively receive organic dye(s) using an inkjet to allow the different colors within a pixel to be realized. For active matrix, the cathode-separation layer 22 would not be formed, as a common cathode may be used because the anodes can be in the shape of pads, as opposed to strips. If an active matrix OLED display is being formed, thin-film circuits may be present with substrate 10. Such thin-film circuits are conventional.

In one embodiment, a multi-colored or full-color passive matrix display may be formed. Six subpixels of two interleaved pixels may be formed with a structure similar to that shown in FIGS. 1–10 except for the organic well structures. For example, referring to FIG. 1, the first and fourth conductive members 12 may correspond to blue subpixels in different pixels, the second and fifth conductive members 12 may correspond to green subpixels in those different pixels, and the third and sixth conductive members 12 may correspond to red subpixels in different pixels. Referring to FIG. 5, the first, second, and third conductive members 522 may be for the red, green, and blue subpixels within one pixel, and the fourth, fifth, and sixth conductive members 522 may be for the red, green, and blue subpixels within another pixel.

In still other embodiments, the materials used for the conductive members 12 and 522 can be reversed. In this manner, the anodes and cathodes are effectively reversed (cathode closer to the user side rather than the anode). Note that if the cathode lies closer to the user side, it may need to be substantially transparent to radiation emitted or received by the electronic device.

Figure 12:
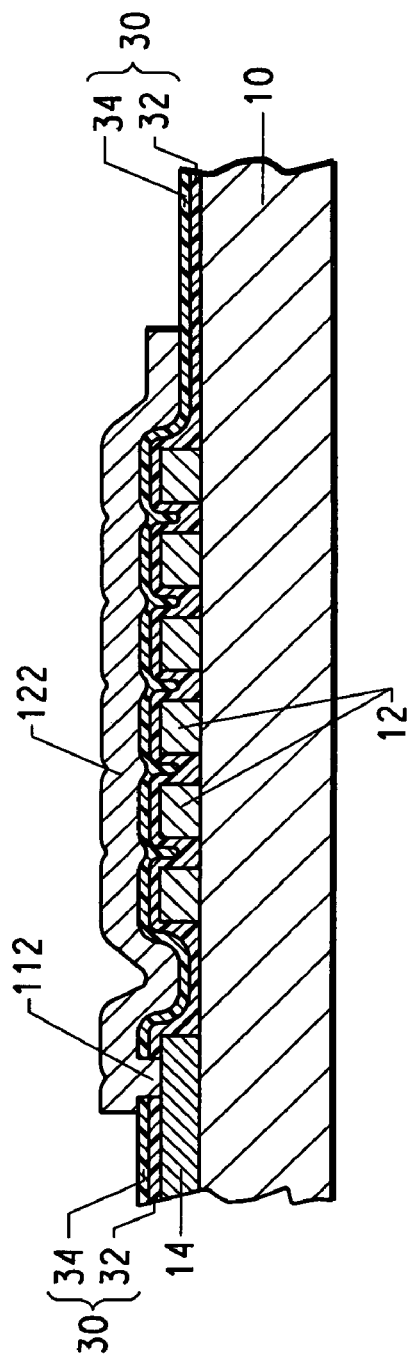
FIG. 12 is a cross-sectional view of the substrate of FIG. 11 after forming a conductive member overlying a lower electrode and contacting a cathode member.
Figure 11:
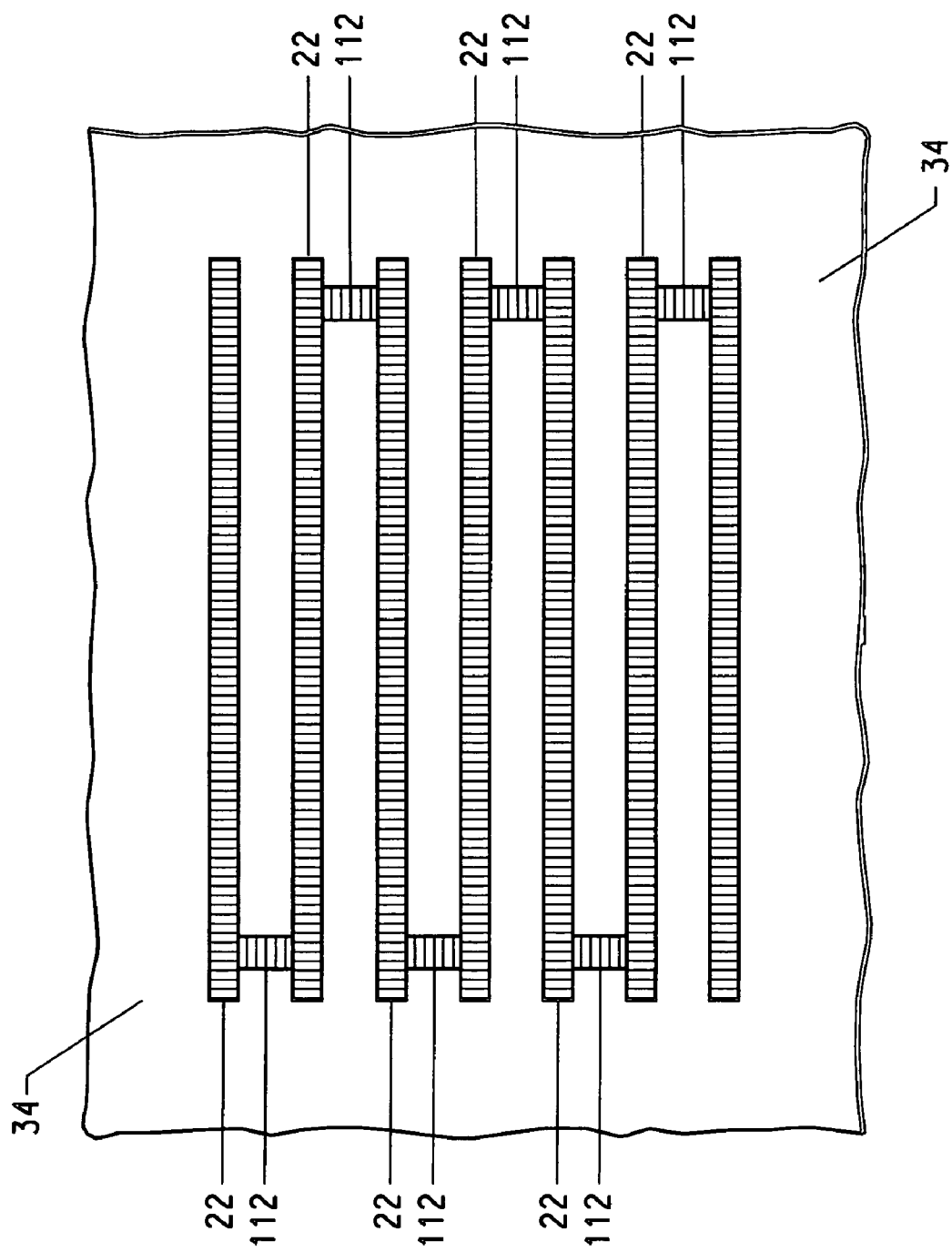
FIG. 11 is a cross-sectional view of the substrate of FIG. 2 at sectioning lines 11—11 after forming organic layers and laser ablating portions of those layers to expose a portion of a conductive lead.

In a further embodiment, a combination of laser ablation and dry etching may be used as illustrated in FIGS. 11–12. Referring to FIG. 2, sectioning lines 11—11 can be used as a reference point. Starting with FIG. 2, the organic layer 30 may be formed as previously described. Unlike a prior embodiment, laser ablation may be used to remove portions of the organic layer 30 within the array to form openings 112. Note that portions of conductive leads 14 are exposed along the bottoms of openings 112. Portions of the organic layer 30 at areas spaced apart from the array (i.e., peripheral and remote circuitry areas) are not removed using laser ablation.

Only shadow mask 80 may be used for the deposition of a patterned conductive layer to form conductive member 122 as shown in FIG. 12. Note that mask 40 previously described is not needed.

A dry etching process, similar to the one previously described, can be used to remove portions of the organic layer 30 outside the array after conductive member 122 is formed. The portions of organic layer 30 that are removed correspond to the bond pads and the rail. Subsequent electrical connections may be made to the bond pads, and an encapsulation layer may be attached at the rail. Because the organic material was removed, one means for moisture and oxygen to ingress under the encapsulation lid is likewise removed.

Embodiments described above have benefits compared to conventional techniques. Laser ablation is not required but could be used optionally. A dry etch process is used to remove portions of organic layers, and the dry etch process has substantially better selectivity to materials or layers underlying the organic layer 30 compared to laser ablation, which has little, if any selectivity. Because laser ablation is not used, device yield and manufacturability is significantly improved without compromising device performance. Cracking of leads as seen with over-ablation during laser ablation should be substantially eliminated.

Laser ablation may effectively redeposit portions of organic layer 30 onto the other areas of the organic electronic device that have been previously cleared due to the physical nature of the process. Unlike laser ablation, dry etching is less likely to cause materials from one portion of the substrate 10 to redeposit on other parts of the substrate 10 because etching products are typically volatile. In one embodiment, no wet cleaning process is necessary to remove the redeposited material from the organic layer.

Another benefit of the process is that new materials and process integration concerns related to new materials are avoided. A dry etch operation replaces the laser ablation operation. The patterned conductive layer 52 and cathode-separation layer 22 act as etch masks during the etching of the organic layer 30. No separate resist layer needs to be formed, patterned, and subsequently removed. Also, the materials for the conductive members 522 and the conductive members 922 do not need to be changed from what is used for conventional processes.

The present invention may be used to contribute to the reduction of the occurrence of dim/bright lines. In one embodiment, the dry etch process is performed over substantially all the substrate at one time. Such a process allows more uniformity compared to laser ablation, which is performed as a series of separate steps at different locations.

Therefore, the contact resistances should be more uniform, which manifests itself in the form of more uniform illumination, as opposed to dim/bright lines.

Conductive leads 14 are fabricated before the conductive members 522. In one embodiment described herein, the contact area (surfaces 102 and 104 in FIG. 10) may be cleaned before the conductive member 922 is formed. Reduced contact resistance may be achieved resulting in better device performance.

Embodiments described herein may improve device lifetime and electrical characteristics due to the elimination of polymers trapped at the base of the cathode-separation layer 22. Portions of the organic layer 30 can be trapped where the base of the cathode-separation layer 22 contacts underlying layers. Those trapped portions of the organic layer 30 can act as reservoirs of moisture that release over time to cause pixel shrinkage. The lifetime of a device is reduced by moisture attacking the pixel edges where they contact the cathode-separation layer 22 edges. Etching away those portions of the polymers during the dry etching helps increase lifetime. The elimination of trapped portions also reduces cross-talk between cathode lines, which can be a problem with spin-on polymer devices (PLEDs).

EXAMPLES

The invention will be further described in the following examples, which do not limit the scope of the invention described in the claims.

Example 1

An OLED can be fabricated according to an embodiment as illustrated in FIGS. 1–10, and compared to an OLED fabricated using a conventional process with extensive laser ablation to remove organic layers. A capacitively coupled March PX-500 (March Plasma Systems, Concord, Calif.) can be used in a two-step dry etch process, operating at 400 mTorr and 100 mW/cm$^2$ with a voltage of 20 to 100 V. A gas mixture of 50% $O_2$, 45% Ar, and 5% $CF_4$ at a flow rate of 100 to 500 sccm can be used for 10 minutes in the first step, and Ar gas can be used alone, for 10 minutes, in the second step. The flow rate in the first step is a combination of flow rates for each individual gas and represents the total flow rate into the reactor that will maintain the desired ratio of gases. The temperature of the reactor can rise from room temperature at the start of the etch process, to a high of approximately 70° C. at the conclusion of the dry etch process.

Alternatively, laser ablation of the conductive leads and deposition of the cathode layers can be performed followed by a single 10 minute dry etch using $O_2$ gas with a flow rate of 100 to 500 sccm at 400 mTorr and 150 mW/cm$^2$ with a voltage of 20 to 100 V. Once again, the process temperature is kept to a maximum of approximately 70° C.

Table 1 below is a comparison of some electrical characteristics. As can be seen, the OLED made using an embodiment of the present invention has superior electronic properties, particularly lower leakage current and a higher rectification ratio.

TABLE 1

|  | OLEDs fabricated using new process described above | Convention OLEDs (Laser ablation only, no dry etch) |
| --- | --- | --- |
| Efficiency | >6 Cd/Amp | >6 Cd/Amp |
| Leakage current | <5 uA | >20 uA |
| Rectification Ratio | >300,000 | <50,000 |

Example 2

This example illustrates the removal of organic layers using a low-density, high-pressure plasma source.

An inductively coupled magnetic neutral loop discharge plasma system (NLD-6000, ULVAC Technologies, Inc., Methuen, Mass.) can be used in a one-step dry etch process to remove organic layers from ITO covered glass substrates at much lower pressures than the capacitively coupled plasma system of Example 1.

After coating the ITO layer with a charge transport layer of PEDOT/Nafion® followed by an electroluminescent layer of PPV (Super Yellow, Covion Organic Semiconductors GmbH, Germany), a low pressure glow discharge ICP etch process using the NLD-6000 was used to remove a portion of the organic layers. Using $O_2$ gas flowing at 200 sccm and operating at 3 mTorr with an ICP power of 2500 W, the organic layers could be successfully removed with an etch uniformity of +/−5%. The substrate was cooled with He, and the temperature at the ITO surface after etching was only 50° C. These result are summarized in Table 2.

TABLE 2

| Sample | Bias Power (W) | Etch Time (s) | DC Bias (V) | Visual Inspection |
| --- | --- | --- | --- | --- |
| A | 150 | 60 | 350 | Clean |
| B | 150 | 30 | 350 | Clean |
| C | 75 | 30 | 215 | Clean |
| D | 75 | 60 | 215 | Clean |

The advantage of the low-pressure high-density plasma lies in the absence of backscattered etched material. In samples A through D, no organic residue is seen on the etched portion of the substrate. Etch rates in excess of 50 nm per minute were obtained.

Example 3

This Example illustrates polymerization of ethylenedioxythiophene in the presence of Nafion® to create a material for a low surface energy charge transport layer.

142.68 g (16.03 mmoles of Nafion® monomer units) SE-10072 and 173.45 g deionized water were poured into a 500 mL Nalgenic® plastic bottle. A stock solution of ferric sulfate was made first by dissolving 0.0667 g ferric sulfate hydrate (97%, Sigma-Aldrich Corp., St. Louis, Mo., USA) with deionized water to a total weight of 12.2775 g. 1.40 g of the ferric sulfate solution and 1.72 g (7.224 mmoles) sodium persulfate (Fluka, Sigma-Aldrich Corp., St. Louis, Mo., USA) were then placed into the plastic bottle. The cap of the Nalgenic® plastic bottle was replaced tightly and the bottle was the shaken vigorously by hand. The bottle contents were poured into a jacketed 500 mL three-necked flask as described above. The mixture was then stirred for 30 minutes in the reaction vessel. 0.63 mL (5.911 mmoles) of Baytron-M (a trade name for 3,4-ethylenedioxythiophene from Bayer, Pittsburgh, USA) was added to the reaction mixture with stirring. Polymerization was allowed to proceed with stirring at about 23° C. In one hour and 7 minutes, the polymerization liquid turned very dark blue and was then distributed into two 250 mL plastic bottles. When dismantling the reaction vessel, no gel particles were noticed on the stirring shaft or on the glass wall of the reaction vessel. Total yield of the polymerization liquid was 297.10 g. The liquid contains 5.303% (w/w) solids assuming no loss and total conversion. The solid is presumed to contain primarily poly(3,4-ethylenedioxythiophene), PEDOT/Nafion®.

148.75 g of the aqueous PEDOT/Nafion® in one of the two plastic bottles was further treated with two ionic exchange resins. One of the two resins is Lewatit® S100, a trade name from Bayer, Pittsburgh, Pa., USA for sodium sulfonate of crosslinked polystyrene. The other ionic exchange resin is Lewatit® MP62 WS, a trade from Bayer, Pittsburgh, Pa., USA for free base/chloride of tertiary/quaternary amine of crosslinked polystyrene. Before use, the two resins were washed with deionized water separately until there was no color observed in the water. 7.75 g of Lewatit® S100 and 7.8 g of Lewatit® MP62® WS were then mixed with the 148.75 g aqueous PEDOT/Nafion® dispersion in a plastic bottle. The bottle was then placed on a roller for stirring for about 23 hours. The resulting slurry was then suction-filtered through a coarse fritted-glass funnel. Yield was 110.2 g. Based on elemental analysis of the sample dried from a 2.6% (w/w) dispersion, the sample contains 21.75% carbon, 0.23% hydrogen, 1.06% nitrogen and 2.45% sulfur. Other elements such as oxygen and fluorine were not analyzed. To remove fluorine interference with sulfur analysis, $CeCl_3$ and a cation exchange resin was added.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A process for forming an organic electronic device comprising the steps of:
   forming a first conductive member and a conductive lead over a substrate, wherein the first conductive member and conductive lead are spaced apart from each other;
   forming an organic layer over the substrate, the first conductive member, and the conductive lead;
   forming a patterned conductive layer over the organic layer, wherein:
   the patterned conductive layer includes a second conductive member; and
   the patterned conductive layer creates an exposed portion of the organic layer and an unexposed portion of the organic layer; and
   dry etching at least the exposed portion of the organic layer to expose a portion of the conductive lead using feed gas comprising, by volume percent, 1 to 100 percent oxygen-containing gas, 0 to 50 percent halogen-containing gas, 0 to 40 percent inert gas, and 0 to 30 percent reducing gas, wherein dry etching is performed at a pressure in a range of approximately 0.01 to 7.5 mTorr.

2. The process of claim 1, wherein dry etching is performed during more than one step.

3. The process of claim 2, wherein the gas in at least a second step comprises at least one inert gas selected from the group consisting of $N_2$, He, and Ar at 50 to 100 volume percent and optionally a reducing gas at 0 to 50 volume percent.

4. The process of claim 3, wherein a reducing gas is used during the second step.

5. The process of claim 1, wherein the gas further comprises a halogen-containing gas.

6. The process of claim 5, wherein the gas comprises at least about 10 percent by volume an oxygen-containing gas comprising $O_2$, the halogen-containing gas comprising $CF_4$ at 4 to 20 volume percent, and an inert gas comprising Ar at 10 to 20 volume percent.

7. The process of claim 6, wherein no reducing gas is used.

8. The process of claim 1, wherein the substrate comprises a polymeric film.

9. The process of claim 1, wherein the organic layer comprises at least one material that is a charge transport, anti-quenching, light-emitting, or photodetector material.

10. The process of claim 1, wherein the organic electronic device is a light-emitting diode, light-emitting display, radiation sensitive device, photoconductive cell, photovoltaic cell, photoresistor, photoswitch, photodetector, phototransistor, or phototube.

11. The process of claim 1, wherein the device is an organic light-emitting diode display.

12. A process for forming an organic electronic device comprising the steps of:
   forming an organic layer comprising organic material over a substrate;
   removing the organic layer at a first area of the substrate corresponding to the pixel array; and
   dry etching using at least one oxygen-containing gas the organic layer at a second area of the substrate which lies outside the pixel array, wherein:
   removing the organic layer at the first area and dry etching at the second area are performed as separate steps; and
   dry etching is performed at a pressure in a range of approximately 0.01 to 7.5 mTorr using feed gas comprising, by volume percent, 1 to 100 percent oxygen-containing gas.

13. The process of claim 12, wherein removing the organic layer is performed using laser ablation.

14. The process of claim 12, wherein dry etching is performed during more than one step.

15. The process of claim 14, wherein the gas in at least a second step comprises at least one inert gas selected from the group consisting of $N_2$, He, and Ar at 50 to 100 volume percent and optionally a reducing gas at 0 to 50 volume percent.

16. The process of claim 15, wherein a reducing gas is used during the second step.

17. The process of claim 12, wherein the gas further comprises a halogen-containing gas.

18. The process of claim 17, wherein the gas comprises at least about 10% by volume an oxygen-containing gas comprising $O_2$, the halogen-containing gas comprising $CF_4$ at 4 to 20 volume percent, and an inert gas comprising Ar at 10 to 20 volume percent.

19. The process of claim 12, wherein the substrate comprises a polymeric film.

20. The process of claim 12, wherein the organic layer comprises at least one material that is a charge transport, anti-quenching, light-emitting, or photodetector material.

21. The process of claim 12, wherein the organic electronic device is a light-emitting diode, light-emitting display, radiation sensitive device, photoconductive cell, photovoltaic cell, photoresistor, photoswitch, photodetector, phototransistor, or phototube.

22. The process of claim 12, wherein the device is an organic light-emitting diode display.

* * * * *